United States Patent
Kim

(10) Patent No.: US 9,087,886 B2
(45) Date of Patent: Jul. 21, 2015

(54) SEMICONDUCTOR DEVICE

(71) Applicant: Samsung Electronics Co., Ltd., Suwon-si (KR)

(72) Inventor: Ju-Youn Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/132,306

(22) Filed: Dec. 18, 2013

(65) Prior Publication Data

US 2014/0299939 A1    Oct. 9, 2014

(30) Foreign Application Priority Data

Apr. 8, 2013   (KR) .................. 10-2013-0038107

(51) Int. Cl.
| | | |
|---|---|---|
| H01L 29/772 | (2006.01) | |
| H01L 21/02 | (2006.01) | |
| H01L 27/092 | (2006.01) | |

(52) U.S. Cl.
CPC ........ *H01L 29/772* (2013.01); *H01L 21/02697* (2013.01); *H01L 27/092* (2013.01)

(58) Field of Classification Search
CPC .............. H01L 29/513; H01L 29/4966; H01L 29/4983; H01L 29/7834; H01L 29/7843; H01L 29/66545; H01L 29/772; H01L 27/092; H01L 21/02697
USPC ............ 257/407, 412, E21.626, E21.64, 369; 438/183, 199, 585, 634, 696, 592
See application file for complete search history.

(56) References Cited

U.S. PATENT DOCUMENTS

| | | | |
|---|---|---|---|
| 6,690,040 B2 | 2/2004 | Chaudhry et al. | |
| 6,861,712 B2 * | 3/2005 | Gao et al. ...................... | 257/369 |
| 7,078,282 B2 | 7/2006 | Chau et al. | |
| 7,208,361 B2 | 4/2007 | Shah et al. | |
| 7,378,286 B2 | 5/2008 | Hsu et al. | |
| 7,795,097 B2 | 9/2010 | Pas | |
| 7,838,356 B2 | 11/2010 | Kirkpatrick et al. | |
| 8,048,792 B2 * | 11/2011 | Beyer et al. ................... | 438/595 |
| 8,062,966 B2 | 11/2011 | Mehrad et al. | |
| 8,450,169 B2 * | 5/2013 | Kwon et al. .................. | 438/216 |
| 8,530,317 B1 * | 9/2013 | Wu et al. ....................... | 438/301 |
| 8,530,326 B2 * | 9/2013 | Lai et al. ....................... | 438/401 |
| 8,679,926 B2 * | 3/2014 | Huang et al. .................. | 438/286 |
| 8,735,235 B2 * | 5/2014 | Chuang et al. ................ | 438/183 |
| 8,748,991 B2 * | 6/2014 | Jagannathan et al. ........ | 257/369 |
| 8,772,168 B2 * | 7/2014 | Xie et al. ....................... | 438/700 |
| 2003/0219953 A1 | 11/2003 | Mayuzumi | |

(Continued)

FOREIGN PATENT DOCUMENTS

| | | |
|---|---|---|
| JP | 2006-352162 | 12/2006 |
| KR | 10-2005-0118466 A1 | 12/2005 |

*Primary Examiner* — Jerome Jackson, Jr.
*Assistant Examiner* — Nilufa Rahim
(74) *Attorney, Agent, or Firm* — Myers Bigel Sibley & Sajovec, P.A.

(57) ABSTRACT

Provided are a semiconductor device and a fabricating method of the semiconductor device. The semiconductor device may include an interlayer dielectric film formed on a substrate and including a trench, a gate insulating film formed in the trench, a first work function control film formed on the gate insulating film of the trench along bottom and sidewalls of the trench, a first metal gate pattern formed on the first work function control film of the trench and filling a portion of the trench, and a second metal gate pattern formed on the first metal gate pattern of the trench, the second metal gate pattern different from the first metal gate pattern.

10 Claims, 23 Drawing Sheets

(56) References Cited

U.S. PATENT DOCUMENTS

| | | |
|---|---|---|
| 2004/0110345 A1 | 6/2004 | Chaudhry et al. |
| 2005/0272191 A1 | 12/2005 | Shah et al. |
| 2006/0166429 A1 | 7/2006 | Chaudhry et al. |
| 2006/0237804 A1 | 10/2006 | Chan et al. |
| 2008/0076216 A1 | 3/2008 | Pae et al. |
| 2008/0265322 A1* | 10/2008 | Lin et al. ............ 257/347 |
| 2011/0031557 A1 | 2/2011 | Kirkpatrick et al. |
| 2011/0057267 A1 | 3/2011 | Chuang et al. |
| 2011/0147831 A1 | 6/2011 | Steigerwald et al. |
| 2011/0183508 A1 | 7/2011 | Chan et al. |
| 2011/0193162 A1 | 8/2011 | Chuang et al. |
| 2012/0088358 A1 | 4/2012 | Lee et al. |
| 2012/0119302 A1 | 5/2012 | Pei et al. |
| 2012/0139015 A1 | 6/2012 | Yu et al. |
| 2012/0146057 A1* | 6/2012 | Hsu et al. ............ 257/77 |
| 2012/0244675 A1 | 9/2012 | Wu et al. |
| 2012/0256238 A1 | 10/2012 | Ning et al. |
| 2012/0270379 A1 | 10/2012 | Lai et al. |
| 2012/0292721 A1* | 11/2012 | Huang et al. ............ 257/412 |
| 2012/0306026 A1* | 12/2012 | Guo et al. ............ 257/407 |
| 2012/0329261 A1* | 12/2012 | Wang et al. ............ 438/589 |
| 2013/0015580 A1* | 1/2013 | Jain et al. ............ 257/751 |
| 2013/0026578 A1* | 1/2013 | Tsau ............ 257/368 |
| 2013/0087837 A1* | 4/2013 | Chang et al. ............ 257/288 |
| 2013/0200467 A1* | 8/2013 | Edge et al. ............ 257/392 |
| 2013/0277686 A1* | 10/2013 | Liu et al. ............ 257/77 |
| 2014/0131809 A1* | 5/2014 | Ando et al. ............ 257/369 |
| 2014/0167187 A1* | 6/2014 | Kuo et al. ............ 257/411 |

* cited by examiner

SEMICONDUCTOR DEVICE

CROSS-REFERENCE TO RELATED APPLICATION

This application claims priority under 35 U.S.C. §119(a) to Korean Patent Application No. 10-2013-0038107 filed on Apr. 8, 2013 in the Korean Intellectual Property Office, the entire contents of which are hereby incorporated by reference.

FIELD

The present inventive concept relates to semiconductor devices and more particularly to metal oxide semiconductor transistors.

BACKGROUND

As the feature size of a metal oxide semiconductor (MOS) transistor has been reduced, the length of a gate and the length of a channel formed therebelow are also gradually decreasing. Accordingly, various studies are under way to increase capacitance between the gate and the channel and to improve operating characteristics of the MOS transistor.

As a thickness of a silicon oxide film mainly used as a gate insulating film is gradually reduced, the silicon oxide film may experience physical limitations in its electrical property. Therefore, in order to replace the conventional silicon oxide film, research into a high-k film having a high dielectric constant is actively being conducted. The high-k film may reduce leakage current between a gate electrode and a channel region while maintaining a small thickness of an equivalent oxide film.

Polysilicon mainly used as a gate material may have higher resistance than most metals. Accordingly, the polysilicon gate electrode may be replaced with a metal gate electrode.

SUMMARY

According to some embodiments of the inventive concept, there is provided a semiconductor device including an interlayer dielectric film formed on a substrate and including a trench, a gate insulating film formed in the trench, a first work function control film formed on the gate insulating film of the trench along bottom and sidewalls of the trench, a first metal gate pattern formed on the first work function control film of the trench and filling a portion of the trench, and a second metal gate pattern formed on the first metal gate pattern of the trench, the second metal gate pattern different from the first metal gate pattern.

The first work control film may include a first inclined surface having an acute angle with respect to the sidewall of the trench. A top surface of the first metal gate pattern may be positioned below the first inclined surface of the work function control film.

The first metal gate pattern may have a thickness in a range between 10 Å to 100 Å.

The first work function control film may be an N type work function control film. The first metal gate pattern may be at least one element selected from the group consisting of aluminum (Al), tungsten (W) and titanium (Ti). The second metal gate pattern may be another at least one element selected from the group consisting of Al, W and Ti.

The semiconductor device may include a first adhesive film disposed between the first work function control film and the first metal gate pattern and between the first work function control film and the second metal gate pattern. The first adhesive film may include a first inclined surface having an acute angle with respect to the sidewall of the trench. The work function control film may include a second inclined surface having an acute angle with respect to the sidewall of the trench. The first inclined surface of the first adhesive film and the second inclined surface of the first work function control film may be continuous.

When the first metal gate pattern is made of tungsten (W), the first adhesive film may be made of titanium nitride (TiN). When the first metal gate pattern is made of aluminum (Al), the first adhesive film may be made of titanium (Ti) or titanium nitride (TiN).

The semiconductor device may include a second an adhesive film disposed between the second metal gate pattern and the second work function control film and between the second metal gate pattern and the first metal gate pattern. When the second metal gate pattern is made of tungsten (W), the second adhesive film may be made of titanium nitride (TiN). When the second metal gate pattern is made of aluminum (Al), the second adhesive film may be made of titanium (Ti) or titanium nitride (TiN).

The semiconductor device may be a fin type transistor.

According to other embodiments of the inventive concept, there is provided a semiconductor device including an interlayer dielectric film formed on a substrate and including a first trench and a second trench spaced apart from the first trench; an NMOS transistor having a first replacement metal gate formed in the first trench; and a PMOS transistor having a second replacement metal gate formed in the second trench. The first replacement metal gate may include a first N type work function control film formed along bottom and sidewalls of the first trench; a first metal gate pattern formed on the first N type work function control film of the first trench and filling a portion of the first trench; and a second metal gate pattern formed on the first metal gate pattern of the first trench, the second metal gate pattern different from the first metal gate pattern. The second replacement metal gate may include a P type work function control film formed along bottom and sidewalls of the second trench; a second N type work function control film formed on the P type work function control film; a third metal gate pattern formed on the second N type work function control film in the second trench and filling a portion of the second trench; and a fourth metal gate pattern formed on the third metal gate pattern in the second trench, the fourth metal gate pattern different from the third metal gate pattern. The first N type work function control film may include a first inclined surface having an acute angle with respect to the sidewall of the first trench.

According to other embodiments of the inventive concept, there is provided a semiconductor device including an interlayer dielectric film on a substrate and including a trench, a gate insulating film on bottom and sidewall surfaces of the trench, an N type work function control film on the gate insulating film, a first metal gate pattern on the N type work function control film and filling a portion of the trench, and a second metal gate pattern on the first metal gate pattern. The N type work function control film may include a first chamfered surface at an opening of the trench defining an acute angle with respect to the sidewall surfaces of the trench. A composition of the second metal gate pattern may be different than a composition of the first metal gate pattern.

The semiconductor device may include an adhesive film between the second metal gate pattern and the N type work function control film and between the second metal gate pattern and the first metal gate pattern. The adhesive film may include a second chamfered surface defining an acute angle with respect to the sidewall of the trench. The second chamfered surface of the adhesive film may be on the first chamfered surface of the N type work function control film.

The semiconductor device may include an adhesive film between the first metal gate pattern and the N type work function control film and between the second metal gate pattern and the N type work function control film. The adhesive film may include a second chamfered surface defining an acute angle with respect to the sidewall of the trench. The first chamfered surface of the N type work function control film and the second chamfered surface of the adhesive film may be continuous.

The semiconductor may include a P type work function control film formed between the gate insulating film and the N type work function control film. The P type work function control film may include a third chamfered surface defining an acute angle with respect to the sidewall of the trench. The third chamfered surface of the P type work function control film and the first chamfered surface of the N type work function control film may be continuous.

The semiconductor device may be a fin type transistor.

DETAILED DESCRIPTION OF THE EMBODIMENTS

Figure 1:
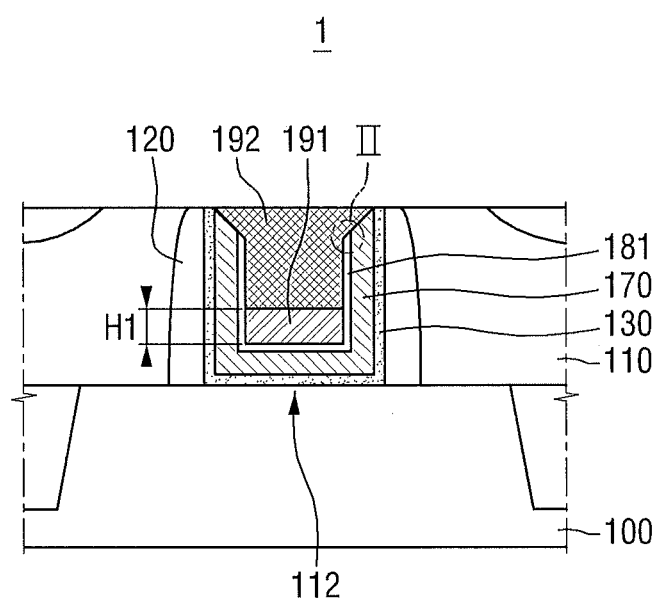
FIG. 1 is a cross-sectional view of a semiconductor device according to an exemplary embodiment of the present inventive concept.

Embodiments of the inventive concept are described more fully with reference to the accompanying drawings. The inventive concept may, however, be embodied in various different forms and should not be construed as limited to the embodiments set forth herein. Rather, these embodiments are provided as examples so that this disclosure will be thorough and complete, and will fully convey the scope of the invention to those skilled in the art. The same reference numbers indicate the same components throughout the specification. In the attached figures, the thickness of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will also be understood that when a layer is referred to as being "on" another layer or substrate, it can be directly on the other layer or substrate, or intervening layers may also be present. In contrast, when an element is referred to as being "directly on" another element, there are no intervening elements present. As used herein, the term "and/or" includes any and all combinations of one or more of the associated listed items and may be abbreviated as "/".

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting to the invention. As used herein, the singular forms "a" and "an" and "the" are intended to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in commonly used dictionaries should be interpreted as having a meaning that is consistent with their meaning in the context of the relevant art and/or the present application, and will not be interpreted in an idealized or overly formal sense unless expressly so defined herein.

The present invention will be described with reference to perspective views, cross-sectional views, and/or plan views, in which preferred embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

Figure 2:
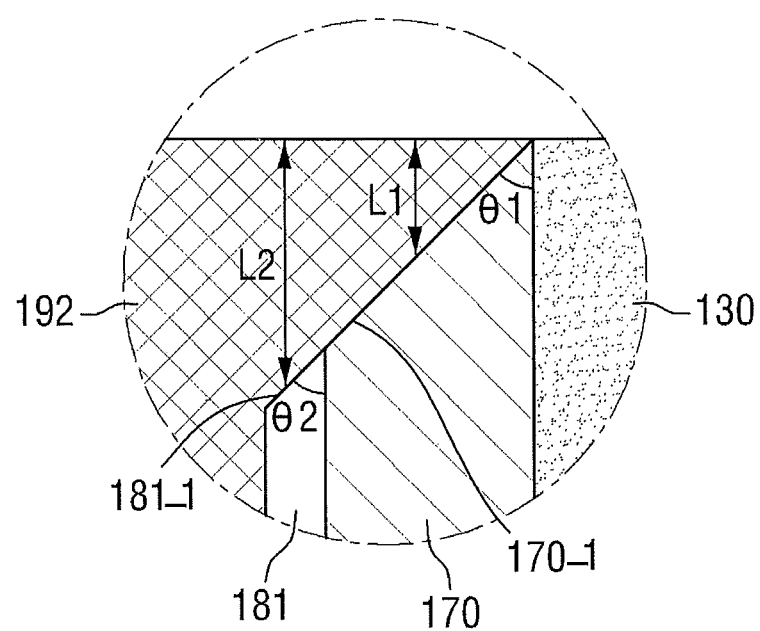
FIG. 2 is an enlarged view of a region II of FIG. 1.

FIG. 1 is a cross-sectional view of a semiconductor device according to an exemplary embodiment of the present inventive concept, and FIG. 2 is an enlarged view of a region II of FIG. 1. In FIG. 1, a gate of an N type transistor is exemplified, but aspects of the present inventive concept are not limited thereto.

Referring to FIG. 1, the semiconductor device 1 may include a substrate 100, an interlayer dielectric film 110 including a trench 112, a gate insulating film 130, an N type work function control film 170, a first adhesive film 181, a first metal gate pattern 191, and a second metal gate pattern 192.

An isolation film such as a shallow trench isolation (STI) film may be formed in the substrate 100 to define an active region. The substrate 100 may be made of one or more semiconductor materials selected from the group consisting of, for example, Si, Ge, SiGe, GaP, GaAs, SiC, SiGeC, InAs and InP. Alternatively, the substrate 100 may be a silicon on insulator (SOI) substrate.

The interlayer dielectric film 110 may be formed on the substrate 100 and may include the trench 112. The interlayer dielectric film 110 may be formed by stacking two or more insulating layers. Sidewalls of the trench 112 may contact the spacer 120 and a bottom surface of the trench 112 may contact the substrate 100, but aspects of the present inventive concept are not limited thereto. The spacer 120 may be formed of at least one of a nitride film and an oxynitride film.

The gate insulating film 130 may be conformally formed along the sidewalls and bottom surface of the trench 112. The gate insulating film 130 may include a high-k dielectric material having a higher dielectric constant than a silicon oxide film. For example, the gate insulating film 130 may include a material selected from the group consisting of $HfO_2$, $ZrO_2$, $Ta_2O_5$, $TiO_2$, $SrTiO_5$ and $(Ba,Sr)TiO_5$. The gate insulating film 130 may be formed to appropriate thicknesses according to the kind of a target device to be formed. For example, when the gate insulating film 130 includes $HfO_2$, it may be formed to a thickness of less than or equal to approximately 50 Å (specifically in a range of approximately 5 to 50 Å).

An etch stop film may be formed on the gate insulating film 130. The etch stop film may include, for example, at least one of TiN and TaN. For example, the etch stop film may be a stack of TiN and TaN films. The etch stop film may be used in removing a portion of the N type work function control film.

The N type work function control film 170 may be formed on the gate insulating film 130 and/or the etch stop film in the trench 112. The N type work function control film 170 may also be conformally formed along the sidewalls and bottom surface of the trench 112. The N type work function control film 170 may control operating characteristics of an N type transistor by controlling a work function of the N type transistor. The N type work function control film 170 may be made of a material selected from the group consisting of TiAl, TiAlC, TiAlN, TaC, TiC, and HfSi, but aspects of the present inventive concept are not limited thereto. For example, the N type work function control film 170 may be a TiAlC film.

The first adhesive film 181 may be formed on the N type work function control film 170 in the trench 112. The first adhesive film 181 may include at least one of TiN and Ti. Alternatively, the first adhesive film 181 may include a TiN film and a Ti film sequentially stacked. The first adhesive film 181 may increase adhesion of a first metal gate pattern 191. For example, when the first metal gate pattern 191 includes Al, the first adhesive film 181 may be a single film made of Ti or TiN. When the first metal gate pattern 191 includes W, the first adhesive film 181 may be a single film made of TiN. The first metal gate pattern 191 may be formed on the first adhesive film 181 in the trench 112 (or on the N type work function control film 170) to fill a portion of the trench 112. The first metal gate pattern 191 may include at least one selected from the group consisting of aluminum (Al), tungsten (W) and titanium (Ti), but aspects of the present inventive concept are not limited thereto.

The second metal gate pattern 192 may be formed on the first metal gate pattern 191 in the trench 112. The second metal gate pattern 192 may include at least one selected from the group consisting of Al, W and Ti, but aspects of the present inventive concept are not limited thereto. However, the second metal gate pattern 192 may be a material different from that of the first metal gate pattern 191. For example, when the first metal gate pattern 191 includes Al, the second metal gate pattern 192 may be made of W.

In FIG. 1, two layers of metal gate patterns 191 and 192 are exemplified, but aspects of the present inventive concept are not limited thereto. Three or more metal gate patterns may also be used.

For example, in a case of a single layer of a metal gate pattern (for example, when the metal gate pattern includes W), there may be a considerable variation in the threshold voltage of the N type transistor according to the height of the metal gate pattern. The height of the trench 112 and heights of various material layers (i.e., the gate insulating film, the N type work function control film, etc.) stacked in the trench 112 may be controlled.

When two or more stacked metal gate patterns 191 and 192 are used, there may be a small variation in the threshold voltage of the N type transistor according to the overall height of the metal gate patterns 191 and 192. Characteristic stability and process stability of the N type transistor can be achieved.

Even if the overall height of the first metal gate pattern 191 and the second metal gate pattern 192 is constant, the threshold voltage of the N type transistor may be controlled according to the change in the height of the first metal gate pattern 191 (or the change in the height of the second metal gate pattern 192).

In addition, resistance of a gate electrode can be controlled by using two or more stacked metal gate patterns 191 and 192. For example, one of the first metal gate pattern 191 and the second metal gate pattern 192 may be made of Al having relatively low resistance.

The first metal gate pattern 191 may be positioned below the first inclined surface 170_1 or the second inclined surface 181_1, which may be for the purpose of securing a sufficient space to be filled with the second metal gate pattern 192. For example, a height H1 of the underlying first metal gate pattern 191 may be in a range between 10 Å to 100 Å.

As shown in FIGS. 1 and 2, the N type work function control film 170 may be conformally formed along the sidewalls and bottom surface of the trench 112. In particular, the N type work function control film 170 includes a first inclined surface 170_1 having an acute angle θ1 with respect to the sidewall of the trench 112. In addition, the first adhesive film 181 includes a second inclined surface 181_1 1 having an acute angle θ2 with respect to the sidewall of the trench 112.

Here, the acute angle θ1 or θ2 may mean that an angle measured clockwise with respect to the sidewall of the trench 112 does not exceed 90 degrees. The N type work function control film 170 may be chamfered.

The acute angle θ1 of the first inclined surface 170_1 may be substantially the same as the acute angle θ2 of the second inclined surface 181_1, but aspects of the present inventive concept are not limited thereto. The acute angle θ1 of the first inclined surface 170_1 and the acute angle θ2 of the second inclined surface 181_1 may be different from each other. For example, the acute angle θ2 of the second inclined surface 181_1 may be greater than the acute angle θ1 of the first inclined surface 170_1, or the acute angle θ2 of the second inclined surface 181_1 may be smaller than the acute angle θ1 of the first inclined surface 170_1.

The first inclined surface 170_1 of the N type work function control film 170 may be continuously formed, but aspects of the present inventive concept are not limited thereto. An end point of the first inclined surface 170_1 and a start point of the second inclined surface 181_1 may not be equal to each other.

A first depth L1 ranging from a top surface of the interlayer dielectric film 110 to the N type work function control film 170 may be different from a second depth L2 ranging from the top surface of the interlayer dielectric film 110 to the first adhesive film 181. For example, the first depth L1 may be smaller than the second depth L2.

In addition, when the first inclined surface 170_1 is formed at an end of the N type work function control film 170, a width of the N type work function control film 170 may be reduced as the N type work function control film 170 gets away from a bottom surface of the trench 112. Likewise, when the second inclined surface 181_1 is formed at an end of the first adhesive film 181, a width of the first adhesive film 181 may be reduced as the first adhesive film 181 gets away from the bottom surface of the trench 112.

Shapes of the N type work function control film 170 and the first adhesive film 181 may improve gap filling characteristics of the first metal gate pattern 191 and the second metal gate pattern 192.

In detail, as the size of a semiconductor device is reduced, sizes of various devices (e.g., transistors) may also be reduced. Therefore, when the size of the trench 112 is reduced, it may be difficult to form multiple functional layers (e.g., a gate insulating film, an etch stop film, a work function control film, an adhesive film, a metal gate patterns, etc.) in the trench 112.

In the semiconductor device 1, when the first inclined surface 170_1 is formed at the end of the N type work function control film 170 and the second inclined surface 181_1 is formed at the end of the first adhesive film 181, an entrance of the trench 112 may be wide. The trench 112 may be filled with a metallic material, which may facilitate forming of the first and second metal gate patterns 191 and 192. When the metallic material is capable of filling a deep portion of the trench 112, a good gap filling characteristic of the metallic material can be exhibited, and the reliability of the semiconductor device 1 may be improved.

Figure 3:
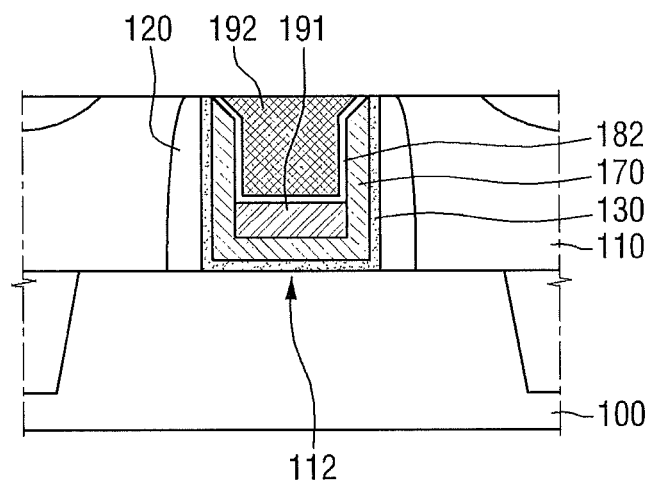
FIG. 3 is a cross-sectional view of a semiconductor device according to another example embodiment of the present inventive concept.

FIG. 3 is a cross-sectional view of a semiconductor device according to another example embodiment of the present inventive concept. Referring to FIG. 3, a second adhesive film 182 may be disposed between a second metal gate pattern 192 and an N type work function control film 170 and between the second metal gate pattern 192 and a first metal gate pattern 191. The second adhesive film 182 may be conformally formed along sidewalls of a first inclined surface 170_1 of the N type work function control film 170 and a top surface of the first metal gate pattern 191.

The second adhesive film 182 may include at least one of TiN and Ti. Alternatively, the second adhesive film 182 may include a TiN film and a Ti film sequentially stacked. The second adhesive film 182 may increase adhesion of the second metal gate pattern 192 to be formed later. For example, when the second metal gate pattern 192 includes Al, the second adhesive film 182 may be a single film made of Ti or TiN. When the second metal gate pattern 192 includes W, the second adhesive film 182 may be a single film made of TiN.

Figure 4:
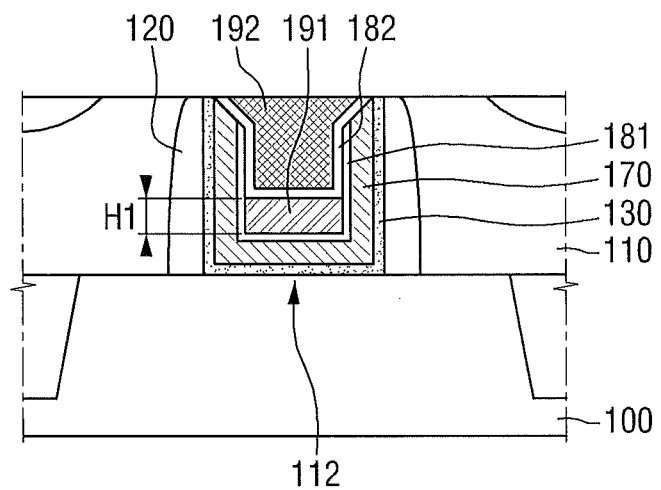
FIG. 4 is a cross-sectional view of a semiconductor device according to another example embodiment of the present inventive concept.

FIG. 4 is a cross-sectional view of a semiconductor device according to another example embodiment of the present inventive concept. Referring to FIG. 4, the semiconductor device 3 may include both of a first adhesive film 181 and a second adhesive film 182.

For example, the first adhesive film 181, a first metal gate pattern 191, the second adhesive film 182 and a second metal gate pattern 192 may include Ti or TiN, Al, TiN and W, respectively. Alternatively, the first adhesive film 181, the first metal gate pattern 191, the second adhesive film 182 and the second metal gate pattern 192 may include TiN, W, Ti or TiN and Al, respectively.

Figure 5:
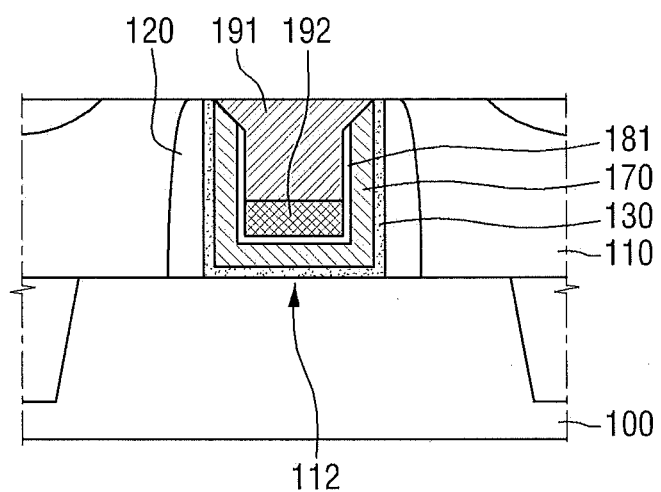
FIG. 5 is a cross-sectional view of a semiconductor device according to another example embodiment of the present inventive concept.

FIG. 5 is a cross-sectional view of a semiconductor device according to another example embodiment of the present inventive concept. Referring to FIG. 5, in the semiconductor device 4, a first metal gate pattern 191 and a second metal gate pattern 192 may be interchanged in position. The second metal gate pattern 192 may fill only a portion of a trench 212. In addition, the second metal gate pattern 192 may be positioned below the first inclined surface 170_1 or the second inclined surface 181_1. For example, when the first metal gate pattern 191 includes Al, the second metal gate pattern 192 may be made of W.

Figure 6:
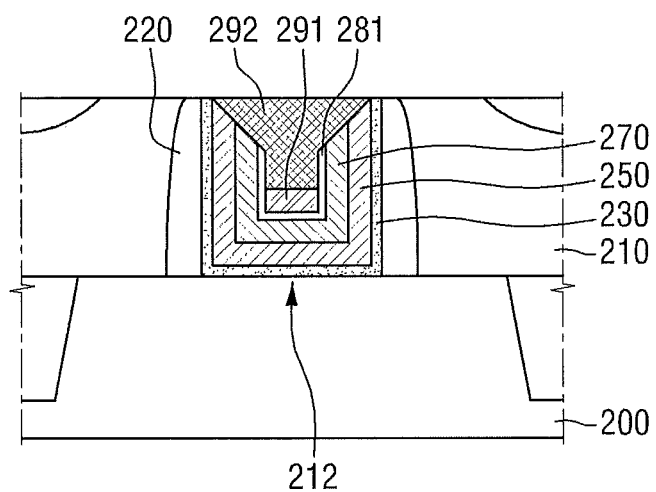
FIG. 6 is a cross-sectional view of a semiconductor device according to another example embodiment of the present inventive concept.

FIG. 6 is a cross-sectional view of a semiconductor device according to another example embodiment of the present inventive concept. In FIG. 6, a gate of a P type transistor is illustrated.

Referring to FIG. 6, the semiconductor device 5 may include a substrate 200, an interlayer dielectric film 210 including a trench 212, a gate insulating film 230, a P type work function control film 250, an N type work function control film 270, a first adhesive film 281, a first metal gate pattern 291, and a second metal gate pattern 292.

The gate insulating film 230 may be conformally formed along sidewalls and bottom surface of the trench 212.

An etch stop film may be formed on the gate insulating film 230.

The P type work function control film 250 may be formed on the gate insulating film 230 (or etch stop film) in the trench 212. As shown in FIG. 6, the P type work function control film 250 may also be conformally formed along the sidewalls and bottom surface of the trench 212. The P type work function control film 250 may control operating characteristics of a P type transistor by controlling a work function of the P type transistor. For example, P type work function control film 250 may be a TiN film, but aspects of the present inventive concept are not limited thereto.

The N type work function control film 270 may be formed on the P type work function control film 250 in the trench 212. If operating characteristics of the P type transistor are not severely impeded, the N type work function control film 270 may be not removed but may be disposed in the P type transistor, which may reduce a number of photolithography steps.

The first adhesive film 281 may be formed on the N type work function control film 270 in the trench 212.

As described above, each of the P type work function control film 250, the N type work function control film 270 and the first adhesive film 281 may include an inclined surface. In addition, the inclined surfaces of the P type work function control film 250, the N type work function control film 270 and the first adhesive film 281 may be interconnected to one another, but aspects of the present inventive concept are not limited thereto.

The first metal gate pattern 291 may be formed on the first adhesive film 281 in the trench 212 to fill a portion of the trench 212.

The second metal gate pattern 192 may be formed on the first metal gate pattern 191 in the trench 212.

Figure 7:
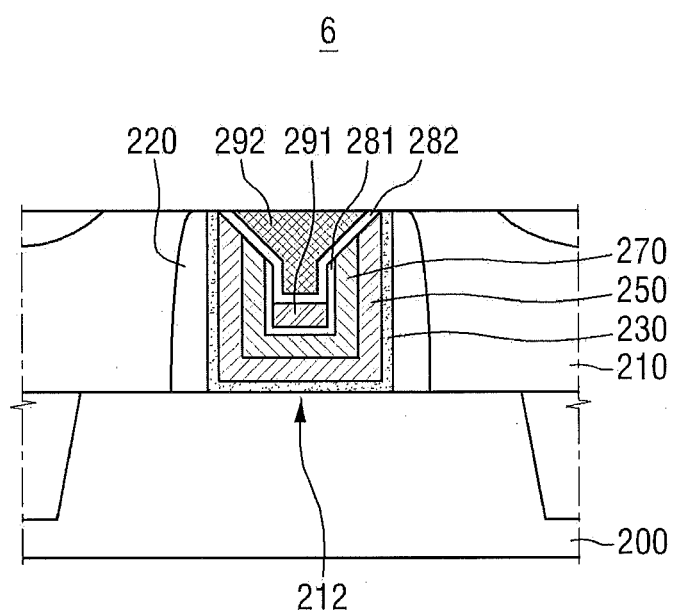
FIG. 7 is a cross-sectional view of a semiconductor device according to another example embodiment of the present inventive concept.

FIG. 7 is a cross-sectional view of a semiconductor device according to another example embodiment of the present inventive concept. Referring to FIG. 7, the semiconductor device 6 may further include a first adhesive film 281 and a second adhesive film 282. The second adhesive film 282 may be disposed between a second metal gate pattern 292 and a P type work function control film 250, between a second metal gate pattern 292 and an N type work function control film 270 and between a second metal gate pattern 292 and a first metal gate pattern 291.

Semiconductor devices according to some embodiments of the present inventive concept may not include a first adhesive film 281 but may include only a second adhesive film 282. In addition, the first metal gate pattern 291 and the second metal gate pattern 292 may be interchanged in position.

Figure 8:
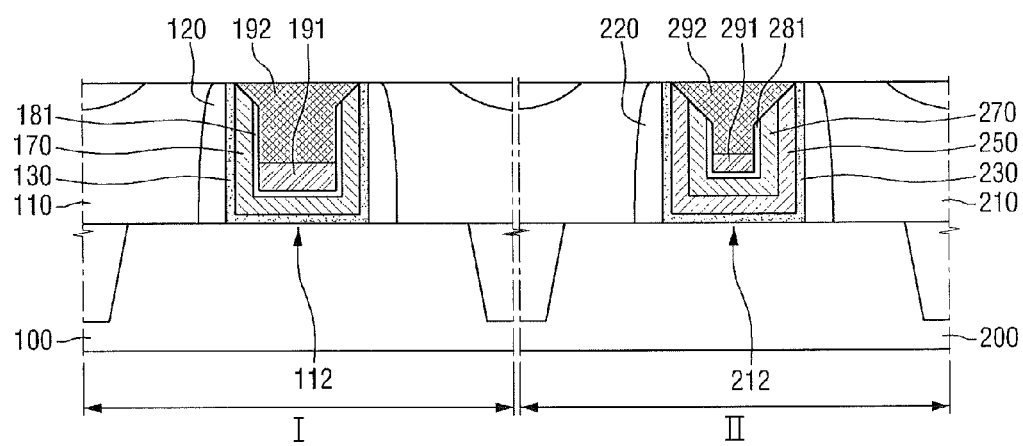
FIG. 8 is a cross-sectional view of a semiconductor device according to another example embodiment of the present inventive concept.

FIG. 8 is a cross-sectional view of a semiconductor device according to another example embodiment of the present inventive concept.

Referring to FIG. 8, in the semiconductor device 7, substrates 100 and 200 are defined in a first region I and a second region II, respectively.

At least one of the N type transistors shown in FIGS. 1 to 5 may be formed in the first region I. At least one of the P type transistors 5 and 6 shown in FIGS. 6 and 7 may be formed in the second region II. For example, the N type transistor shown in FIG. 1 may be formed in the first region I and the P type transistor shown in FIG. 6 may be simultaneously formed in the second region II, but aspects of the present inventive concept are not limited thereto.

Figure 9:
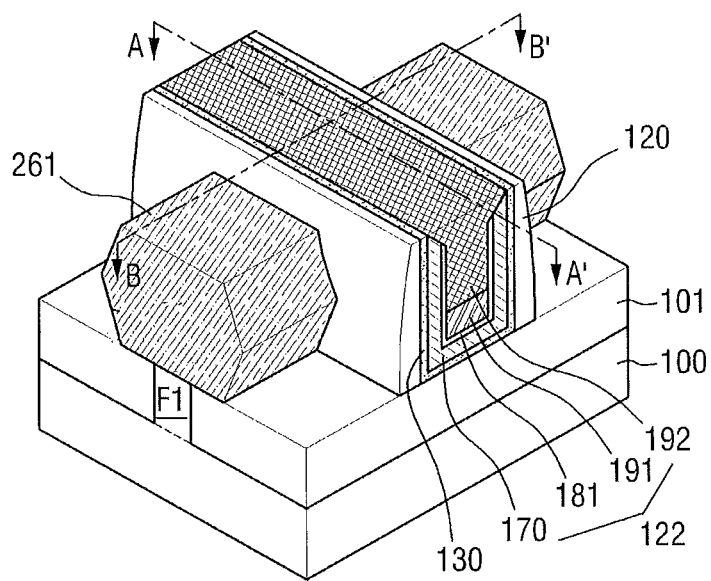
FIGS. 9 to 11 illustrate a semiconductor device according to another example embodiment of the present inventive concept.
Figure 10:
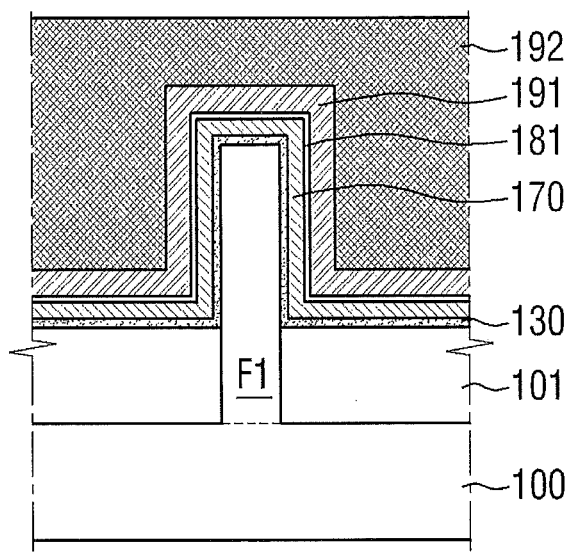
Figure 11:
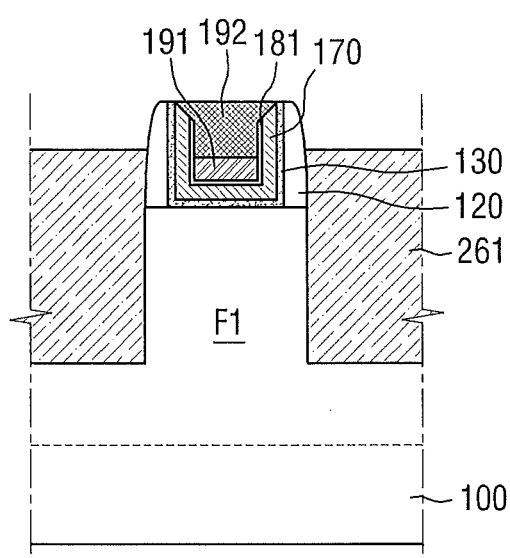

FIGS. 9 to 11 illustrate a semiconductor device according to another example embodiment of the present inventive concept. FIG. 9 is a perspective view illustrating the semiconductor device, FIG. 10 is a cross-sectional view taken along the line A-A' of FIG. 9, and FIG. 11 is a cross-sectional view taken along the line B-B' of FIG. 9. FIGS. 9 to 11 illustrate a gate of the N type transistor shown in FIG. 1, which is applied to a fin type transistor (FinFET).

Referring to FIGS. 9 to 11, the semiconductor device 8 may include a fin F1, a gate electrode 122, and a source/drain 261.

The fin F1 may extend lengthwise in a direction Y1. The fin F1 may be a portion of a substrate 100, and may include an epitaxial layer grown from the substrate 200. An isolation film 101 may cover lateral surfaces of the fin F1.

The gate electrode 122 may be formed on the fin F1 to intersect the fin F1. The gate electrode 122 may extend in a direction X1.

The gate electrode 122 may include an N type work function control film 170, a first adhesive film 181, a first metal gate pattern 191, and a second metal gate pattern 192.

The source/drain 261 may be disposed at opposite sides of the gate electrode 122. The source/drain 261 may be an elevated source/drain. A top surface of the source/drain 261 may be higher than a bottom surface of the isolation film 101. In addition, the source/drain 261 and the gate electrode 122 may be insulated from each other by spacer 120.

In a case where the semiconductor device 8 is an N type transistor, the source/drain 261 may include a tensile stress material. The source/drain 261 may include the same material as the substrate 100 or the tensile stress material. For example, when the substrate 200 includes Si, the source/drain 261 may include Si or a material having a smaller lattice constant than Si (e.g., SiC).

The gates of the N type transistors shown in FIGS. 3 to 5 may similarly be applied to fin type transistors.

Alternatively, in a case where a gate of a P type transistor (e.g., the gate shown in FIG. 6) is applied to a fin type transistor, the source/drain 261 may include a compressive stress material. For example, the compressive stress material may be a material having a larger lattice constant than silicon (Si), for example, SiGe. The compressive stress material may improve the mobility of carriers of a channel region by applying compressive stress to the fin F1.

Figure 12:
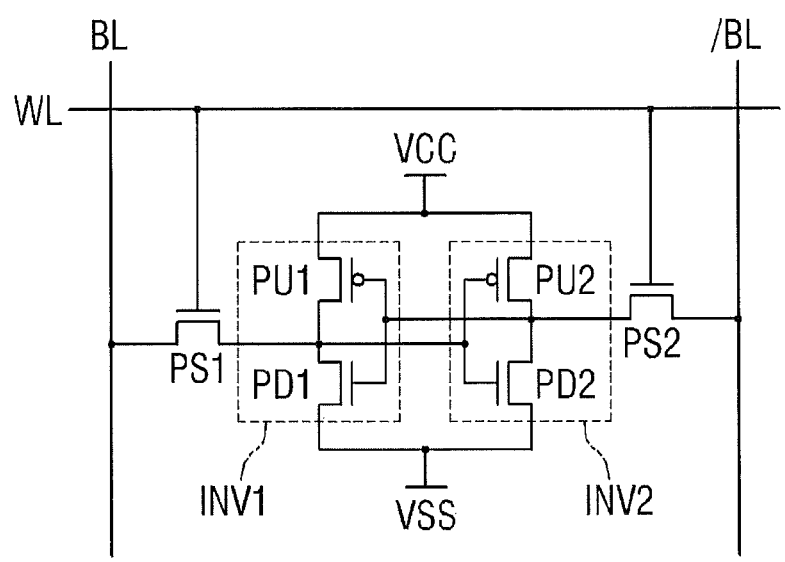
FIGS. 12 and 13 are a circuit view and a layout view illustrating a semiconductor device according to another example embodiment of the present inventive concept.
Figure 13:
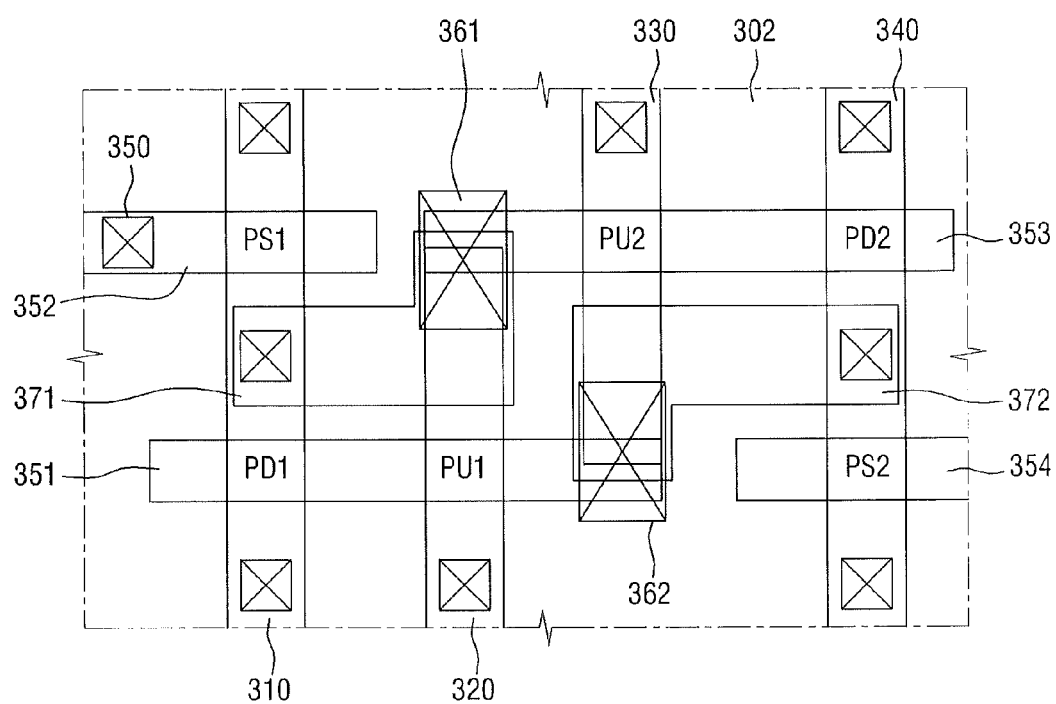

FIGS. 12 and 13 are a circuit view and a layout view illustrating a semiconductor device according to another example of the present inventive concept.

Referring to FIGS. 12 and 13, the semiconductor device 9 may include a pair of inverters INV1 and INV2 connected in parallel between a power supply node Vcc and a ground node Vss, and a first pass transistor PS1 and a second pass transistor PS2 connected to output nodes of the respective inverters INV1 and INV2. The first pass transistor PS1 and the second pass transistor PS2 may be connected to a bit line BL and a complementary bit line BL/, respectively. Gates of the first pass transistor PS1 and the second pass transistor PS2 may be connected to a word line WL.

The first inverter INV1 includes a first pull-up transistor PU1 and a first pull-down transistor PD1 connected in series to each other, and the second inverter INV2 includes a second pull-up transistor PU2 and a second pull-down transistor PD2 connected in series to each other. The first pull-up transistor PU1 and the second pull-up transistor PU2 may be PMOS transistors, and the first pull-down transistor PD1 and the second pull-down transistor PD2 may be NMOS transistors.

In order to constitute a latch circuit, an input node of the first inverter INV1 may be connected to an output node of the second inverter INV2 and an input node of the second inverter INV2 may be connected to an output node of the first inverter INV1.

Referring to FIGS. 12 and 13, a first active region 310, a second active region 320, a third active region 330 and a fourth active region 340, which may be spaced apart from one another, may extend lengthwise in a direction (e.g., in an up-and-down direction of FIG. 13). The second active region 320 and the third active region 330 may extend in smaller lengths than the first active region 310 and the fourth active region 340.

In addition, a first gate electrode 351, a second gate electrode 352, a third gate electrode 353, and a fourth gate electrode 354 may be formed to extend in the other direction (for example, in a left-and-right direction of FIG. 13) to intersect the first active region 310 to the fourth active region 340. The first gate electrode 351 may completely intersect the first active region 310 and the second active region 320 while partially overlapping a terminal of the third active region 330. The third gate electrode 353 may completely intersect the fourth active region 340 and the third active region 330 while partially overlapping a terminal of the second active region 320. The second gate electrode 352 and the fourth gate electrode 354 may be formed to intersect the first active region 310 and the fourth active region 340, respectively.

The first pull-up transistor PU1 may be defined in vicinity of an intersection of the first gate electrode 351 and the second active region 320, the first pull-down transistor PD1 may be defined in vicinity of an intersection of the first gate electrode 351 and the first fin F1, and the first pass transistor PS1 may be defined in vicinity of an intersection of the second gate electrode 352 and the first active region 310. The second pull-up transistor PU2 may be defined in vicinity of an intersection of the third gate electrode 353 and the third active region 330, the second pull-down transistor PD2 may be defined in vicinity of an intersection of the third gate electrode 353 and the fourth active region 340, and the second pass transistor PS2 may be defined in vicinity of an intersection of the fourth gate electrode 354 and the fourth active region 340.

Sources/drains may be formed at opposite sides of the respective intersections of the first to fourth gate electrodes 351-354 and the first to fourth active regions 310, 320, 330 and 340.

In addition, a plurality of contacts 350 may be formed.

A shared contact 361 may concurrently connect the second active region 320, a third gate line 353 and an interconnection 371. The shared contact 361 may also concurrently connect the third active region 330, a first gate line 351 and an interconnection 372.

For example, the first pull-up transistor PU1 and the second pull-up transistor PU2 may have configurations described above with regard to at least one of the gates shown in FIGS. 6 and 7 and the first pull-down transistor PD1, the first pass transistor PS1, the second pull-down transistor PD2 and the second pass transistor PS2 may have configurations described above with regard to at least one of the gates shown in FIGS. 1 to 5.

Figure 14:
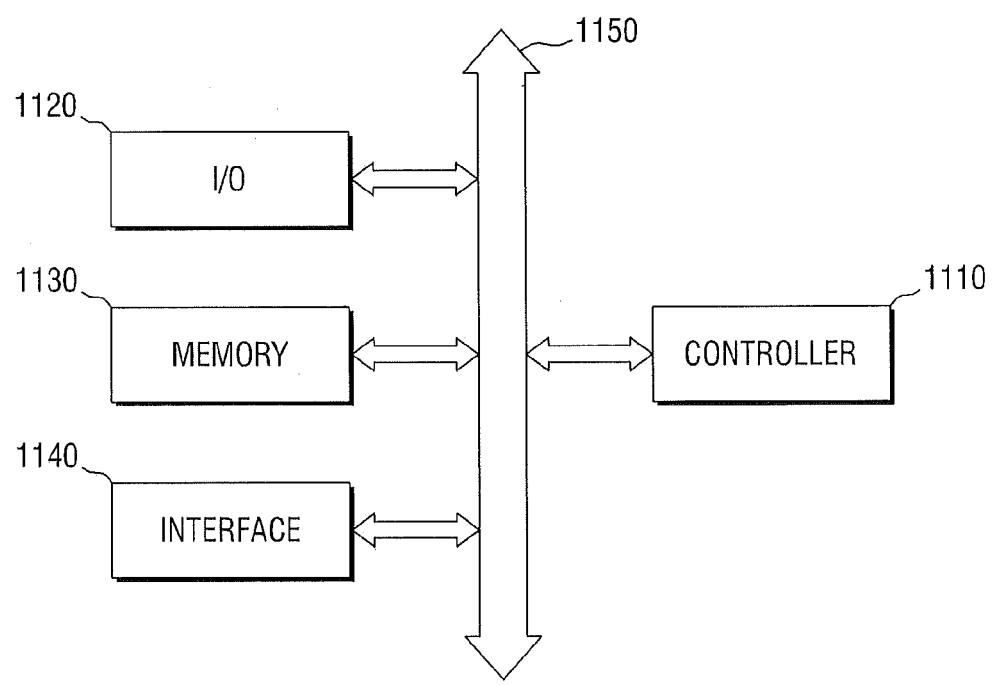
FIG. 14 is a block diagram of an electronic system including a semiconductor device according to some embodiments of the present inventive concept.

FIG. 14 is a block diagram of an electronic system including a semiconductor device according to some embodiments of the present inventive concept.

Referring to FIG. 14, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a key pad, a key board, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on. The electronic system 1100 may further include high-speed DRAM and/or SRAM as the operating memory for improving the operation of the controller 1110.

Fin electric field effect transistors according to some embodiments of the present inventive concept may be provided in the memory device 1130 or may be provided some components of the controller 1110 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 15:
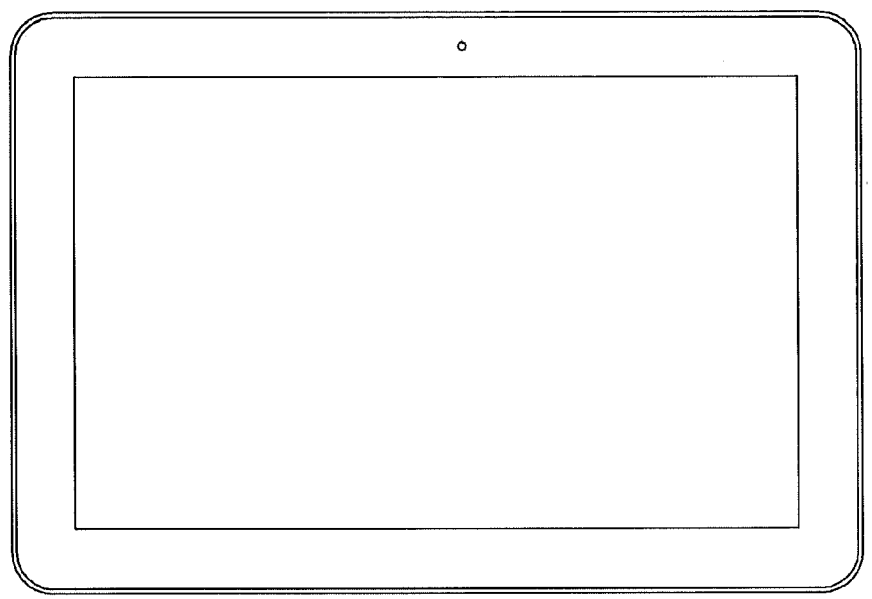
FIGS. 15 and 16 illustrate an exemplary semiconductor system to which semiconductor devices according to some embodiments of the present inventive concept can be employed.
Figure 16:
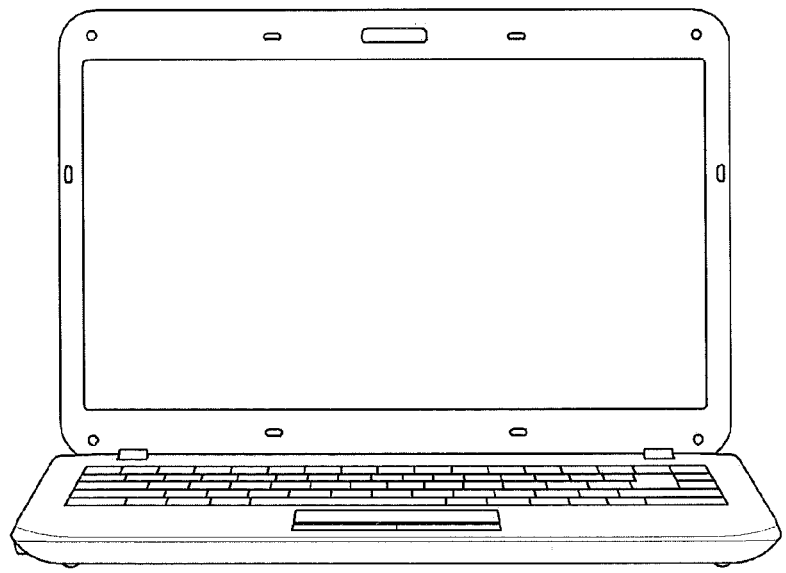

FIGS. 15 and 16 illustrate an exemplary semiconductor system to which semiconductor devices according to some embodiments of the present inventive concept can be employed. FIG. 15 illustrates an example in which a semiconductor device according to an embodiment of the present inventive concept is applied to a tablet PC, and FIG. 16 illustrates an example in which a semiconductor device according to an embodiment of the present inventive concept is applied to a notebook computer. At least one of the semiconductor devices 1 to 9 according to some embodiments of the present inventive concept can be employed to a tablet PC, a notebook computer, and the like. It is obvious to one skilled in the art that the semiconductor devices according to some embodiments of the present inventive concept may also be applied to other IC devices not illustrated herein.

A method of fabricating a semiconductor device will be described with reference to FIGS. 17 to 24 together with FIG. 8, FIGS. 17 to 24 illustrate intermediate process steps for explaining a method of fabricating the semiconductor device 7 illustrated in FIG. 8.

Figure 17:
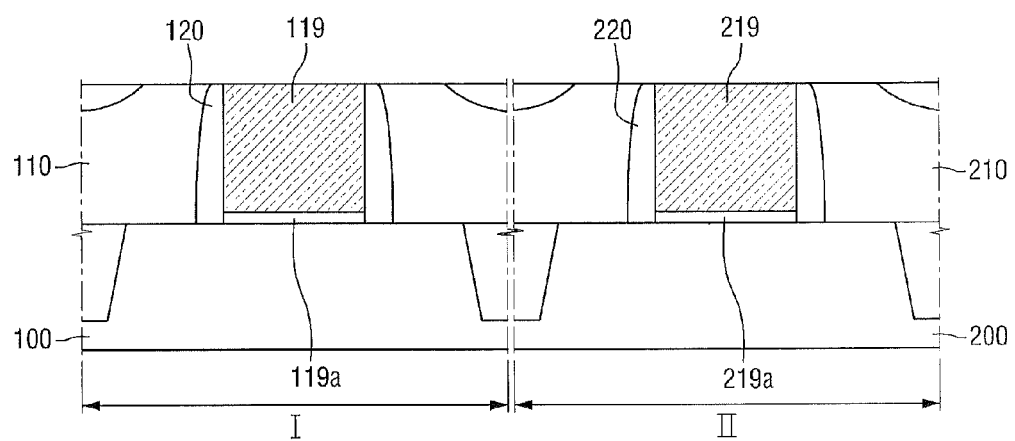
FIGS. 17 to 24 illustrate intermediate process steps for explaining a fabricating method of the semiconductor device illustrated in FIG. 8.

Referring first to FIG. 17, a substrate 100 having a first region I and a second region II defined therein is provided.

A sacrificial gate pattern 119 may be formed on the first region I, and a spacer 120 may be formed on sidewalls of the sacrificial gate pattern 119. The interlayer dielectric film 110 may surround the sacrificial gate pattern 119 and the spacer 120, and a top surface of the sacrificial gate pattern 119 may be exposed.

A sacrificial gate pattern 219 may be formed on the second region II, and a spacer 220 may be formed on sidewalls of the sacrificial gate pattern 219. The interlayer dielectric film 210 may surround the sacrificial gate pattern 219 and the spacer 220, and a top surface of the sacrificial gate pattern 219 may be exposed.

Each of the sacrificial gate patterns 119 and 219 may include, for example, polysilicon, but aspects of the present inventive concept are not limited thereto.

Figure 18:
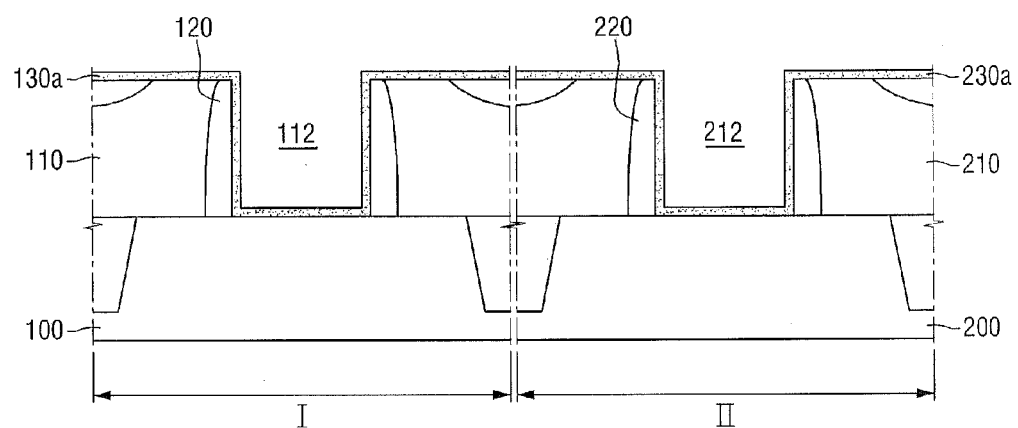

Referring to FIG. 18, the sacrificial gate patterns 119 and 219 may be removed, thereby completing the interlayer dielectric film 110 including the trench 112 in the first region I, and completing the interlayer dielectric film 210 including the trench 212 in the second region II.

Next, a gate insulating film 130a may be formed in the trench 112 and a gate insulating film 230a may be formed in the trench 212. In detail, the gate insulating film 130a may be conformally formed along the top surface of the interlayer dielectric film 110 and the sidewalls and bottom surface of the trench 112. The gate insulating film 230a may be conformally formed along the top surface of the interlayer dielectric film 210 and the sidewalls and bottom surface of the trench 212. The gate insulating film 130a and the gate insulating film 230a may be high-k films.

Figure 19:
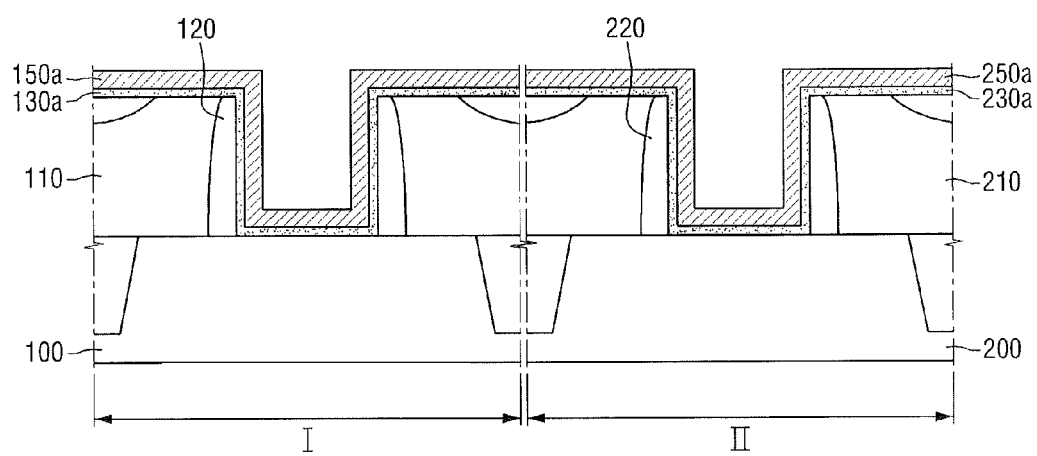

Referring to FIG. 19, P type work function control films 150a and 250a may be formed on the gate insulating films 130a and 230a.

As shown in FIG. 19, the P type work function control films 150a and 250a may be conformally formed along the top surface of the interlayer dielectric film 110 and the sidewalls and bottom surface of the trench 112, and the top surface of the interlayer dielectric film 210 and the sidewalls and bottom surface of the trench 212, respectively.

The P type work function control films 150a and 250a may include, for example, TiN.

Figure 20:
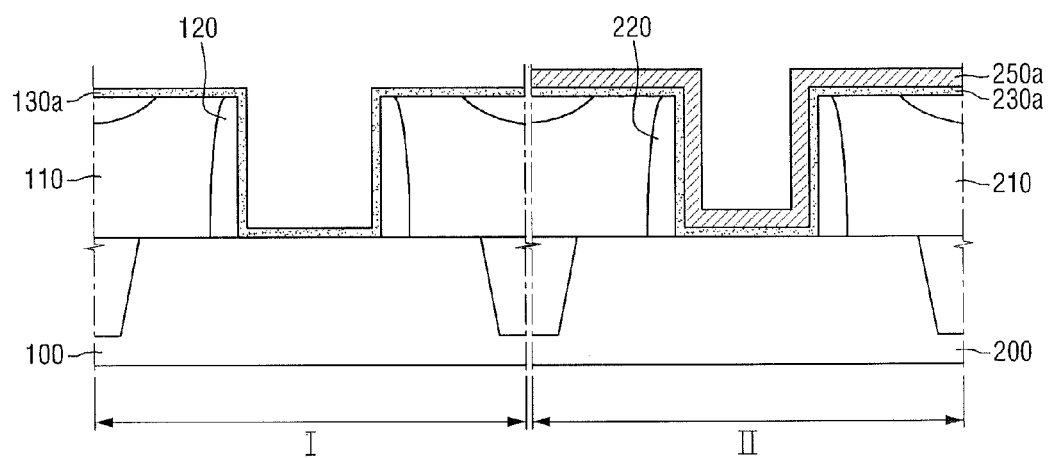

Referring to FIG. 20, the P type work function control film 150a formed on the first region I may be removed, and the P type work function control film 250a formed on the second region II may be made to remain. The P type work function control film 250a may remain on the gate insulating film 230a in the trench 212.

Figure 21:
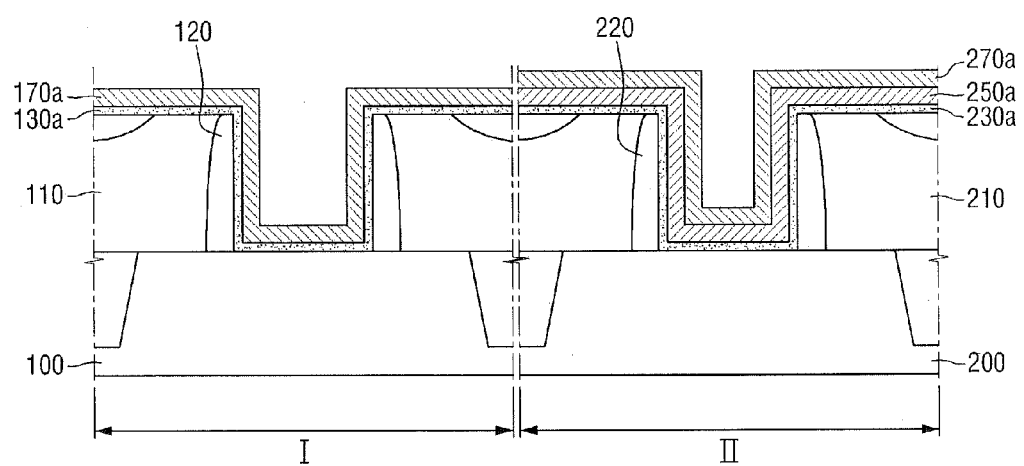

Referring to FIG. 21, an N type work function control film 170a may be formed on the gate insulating film 130a in the trench 112 and an N type work function control film 270a may be formed on the P type work function control film 250a in the trench 212.

As shown in FIG. 21, the N type work function control films 170a and 270a may be conformally formed along the top surface of the interlayer dielectric film 110 and the sidewalls and bottom surface of the trench 112, and the top surface of the interlayer dielectric film 210 and the sidewalls and bottom surface of the trench 212, respectively.

Figure 22:
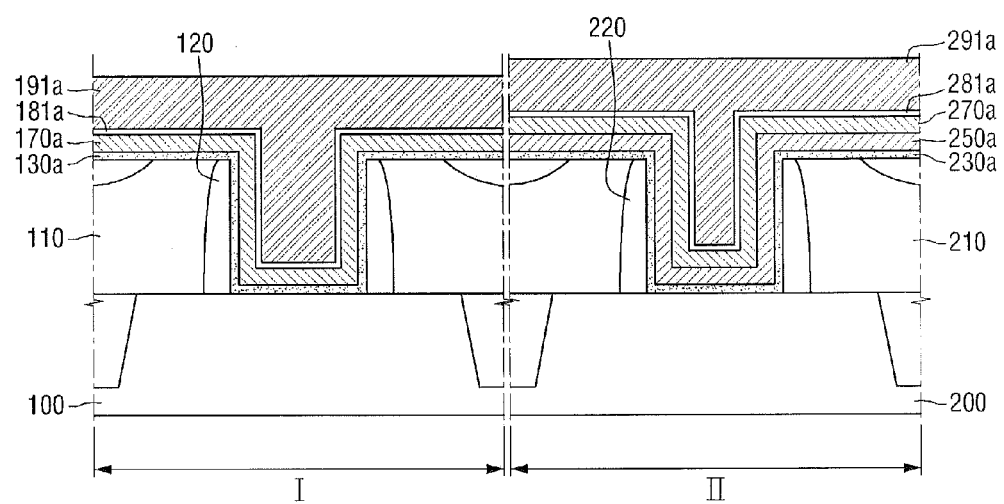

Referring to FIG. 22, a first adhesive film 181a may be conformally formed on the N type work function control film 170a in the first region I, and a first adhesive film 281a may be conformally formed on the N type work function control film 270a in the second region II.

Subsequently, a first metal gate material film 191a may be formed on the first adhesive film 181a in the first region I to sufficiently cover the trench 112, and a first metal gate material film 291a may be formed on the first adhesive film 281a in the second region II to sufficiently cover the trench 212.

Figure 23:
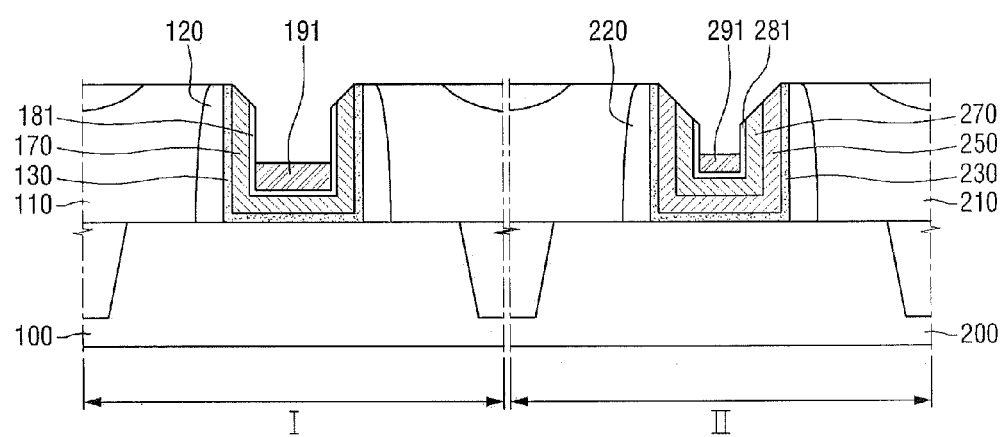

Referring to FIG. 23, portions of the first metal gate material film 191a, the first adhesive film 181a, and the N type work function control film 170a formed in the first region I may be removed, and portions of the first metal gate material film 291a, the first adhesive film 281a, the N type work function control film 270a and the P type work function control film 250a formed in the second region II may be removed. As the result, in the first region I, each of the first adhesive film 181 and the N type work function control film 170 may have an acute angle with respect to the sidewall of the trench 112. In the second region II, each of the second adhesive film 281, the N type work function control film 270 and the P type work function control film 250 may have an acute angle with respect to the sidewall of the trench 212.

Here, reactive ion etching (RIE), for example, may be used. In detail, corner portions of the first adhesive film 181a and the N type work function control film 170a, on which electric fields concentrate, may be more etched. Likewise, corner portions of the first adhesive film 281a, the N type work function control film 270a and the P type work function control film 250a, on which electric fields concentrate, may be much more etched. The corner portions of the first adhesive film 181a and the N type work function control film 170a, which are positioned in the entrance of the trench 112 in the first region I, may be etched. Likewise, the corner portions of the first adhesive film 281a, the N type work function control film 270a and the P type work function control film 250a, which are positioned in the entrance of the trench 212 in the second region II, may be etched. In such a manner, as shown in FIG. 23, the completed N type work function control film 270 and the completed P type work function control film 250 may be chamfered.

In other words, in the first region I, portions of the first adhesive film 181a and the N type work function control film 170a which are closer to the first metal gate material film 191a are etched more than portions of the first adhesive film 181a and the N type work function control film 170a which are closer to the gate insulating film 130a, producing the completed first adhesive film 181 and the completed N type work function control film 170 each with a chamfered edge at an opening of the trench 112 defining an acute angle with respect to the sidewall of the trench 112. Similarly, in the second region II, portions of the first adhesive film 281a, the N type work function control film 170a, and the P type work function control film 250a which are closer to the first metal gate material film 291a are etched more than portions of the first adhesive film 281a, the N type work function control film 270a, and the P type work function control film 250a which are closer to the gate insulating film 230a, producing the completed first adhesive film 281, the completed N type work function control film 270, and the completed P type work function control film 250 each with a chamfered edge at an opening of the trench 212 defining an acute angle with respect to the sidewall of the trench 212.

In the first region I, a portion of the first metal gate pattern 191 may remain in the trench 112. The first metal gate pattern 191 may be positioned below the inclined surfaces of the first adhesive film 181 and the N type work function control film 170.

In the second region II, a portion of the first metal gate pattern 291 may remain in the trench 212. The first metal gate pattern 291 may be positioned below the inclined surfaces of the first adhesive film 281, the N type work function control film 270 and the P type work function control film 250.

Figure 24:
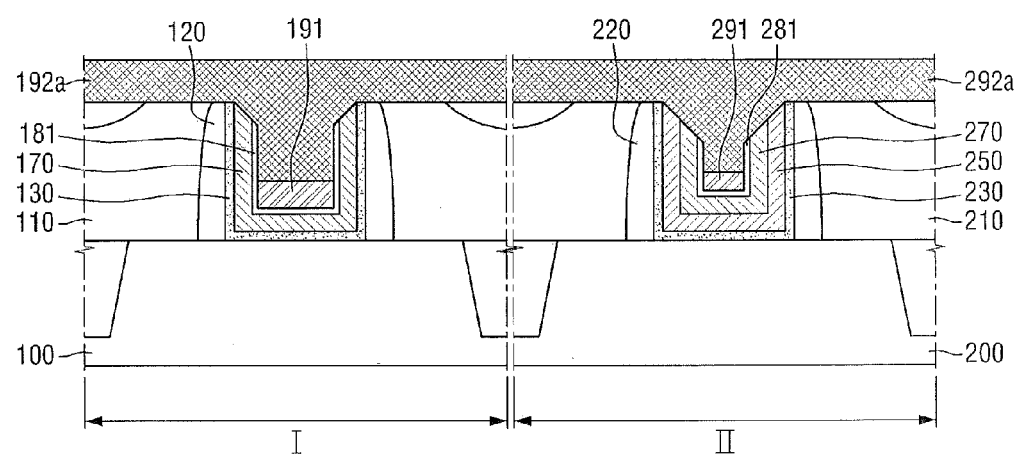

Referring to FIG. 24, a second metal gate material film 192a may be formed to fill the trench 112 and a second metal gate material film 292a may be formed to fill the trench 212.

Referring again to FIG. 8, a planarization process may be performed to expose top surfaces of the interlayer dielectric films 110 and 210. Through the planarization process, a first replacement metal gate of an N type transistor may be completed in the first region I and a second replacement metal gate of a P type transistor may be completed in the second region II.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:
1. A semiconductor device comprising:
an interlayer dielectric film formed on an upper surface of a substrate, the interlayer dielectric film including a trench;
a gate insulating film formed in the trench;
a work function control film formed on the gate insulating film of the trench along bottom and sidewalls of the trench;
a first metal gate pattern on the work function control film of the trench and filling a portion of the trench;
a second metal gate pattern on the first metal gate pattern of the trench, the second metal gate pattern different from the first metal gate pattern; and
an adhesive film disposed between the second metal gate pattern and the work function control film and between the second metal gate pattern and the first metal gate pattern,
wherein a distance from the upper surface of the substrate to an uppermost surface of the second metal gate pattern is greater than a distance from the upper surface of the substrate to an uppermost surface of the first metal gate pattern.

2. The semiconductor device of claim 1, wherein the work function control film includes an inclined uppermost surface defining an acute angle with respect to the sidewalls of the trench.

3. The semiconductor device of claim 2, wherein a top surface of the first metal gate pattern is positioned below the inclined uppermost surface of the work function control film.

4. The semiconductor device of claim 1, wherein the first metal gate pattern has a thickness in a range between 10 Å to 100 Å.

5. The semiconductor device of claim 1, wherein the semiconductor device is an NMOS transistor, the first metal gate pattern is at least one element selected from the group consisting of aluminum (Al), tungsten (W) and titanium (Ti), and the second metal gate pattern is another at least one element selected from the group consisting of Al, W and Ti.

6. The semiconductor device of claim 1, wherein when the second metal gate pattern is made of tungsten (W), the adhesive film is made of titanium nitride (TiN), and when the second metal gate pattern is made of aluminum (Al), the adhesive film is made of titanium (Ti) or titanium nitride (TiN).

7. The semiconductor device of claim 1, wherein the semiconductor device is a fin type transistor.

8. A semiconductor device comprising:
an interlayer dielectric film formed on an upper surface of a substrate, the interlayer dielectric film including a first trench and a second trench spaced apart from the first trench;
an NMOS transistor having a first replacement metal gate formed in the first trench; and
a PMOS transistor having a second replacement metal gate formed in the second trench, wherein the first replacement metal gate comprises:
   a work function control film along a bottom and sidewalls of the first trench;
   a first metal gate pattern on the work function control film of the first trench and filling a portion of the first trench; and
   a second metal gate pattern on the first metal gate pattern of the first trench, the second metal gate pattern different from the first metal gate pattern,
wherein the work function control film of the first replacement metal gate is a first work function control film comprising a first material, and
wherein the second replacement metal gate comprises:
   a second work function control film comprising a second material different from the first material, the second work function control film formed along bottom and sidewalls of the second trench,
   a third work function control film comprising the first material, the third work function control film formed on the P type work function control film;
   a third metal gate pattern formed on the third work function control film in the second trench and filling a portion of the second trench; and
   a fourth metal gate pattern formed on the third metal gate pattern in the second trench, the fourth metal gate pattern different from the third metal gate pattern.

9. A semiconductor device comprising:
an interlayer dielectric film on an upper surface of a substrate, the interlayer dielectric film including a trench;
a gate insulating film on a bottom and sidewall surfaces of the trench;
a work function control film on the gate insulating film comprising a chamfered uppermost surface at an opening of the trench defining an acute angle with respect to the sidewall surfaces of the trench;
a first metal gate pattern on the work function control film and filling a portion of the trench; and
a second metal gate pattern on the first metal gate pattern, the second metal gate pattern comprising a different composition from a composition of the first metal gate pattern,
wherein a distance from the upper surface of the substrate to an uppermost surface of the second metal gate pattern is greater than a distance from the upper surface of the substrate to an uppermost surface of the first metal gate pattern,
further comprising an adhesive film between the second metal gate pattern and the work function control film and between the second metal gate pattern and the first metal gate pattern, the adhesive film including a chamfered uppermost surface defining an acute angle with respect to the sidewall surfaces of the trench, wherein the chamfered uppermost surface of the adhesive film is on the chamfered uppermost surface of the work function control film.

10. The semiconductor device of claim 9, wherein the work function control film is a first work function control film comprising a first material, wherein the semiconductor device further comprises a second work function control film between the gate insulating film and the first work function control film, the second work function control film comprising a second material different from the first material, wherein the second work function control film includes a chamfered uppermost surface defining an acute angle with respect to the sidewall surfaces of the trench, and
wherein the chamfered uppermost surface of the second work function control film and the chamfered uppermost surface of the first work function control film are continuous.

* * * * *